US009971913B1

(12) United States Patent
Patapoutian et al.

(10) Patent No.: US 9,971,913 B1
(45) Date of Patent: May 15, 2018

(54) ADAPTIVELY COMBINING WAVEFORMS

(71) Applicant: Seagate Technology LLC, Cupertino, CA (US)

(72) Inventors: Ara Patapoutian, Hopkinton, MA (US); Rishi Ahuja, Broomfield, CO (US); Jason Charles Jury, Minneapolis, MN (US); Raman C Venkataramani, Longmont, CO (US)

(73) Assignee: Seagate Technology LLC, Cupertino, CA (US)

( * ) Notice: Subject to any disclaimer, the term of this patent is extended or adjusted under 35 U.S.C. 154(b) by 0 days. days.

(21) Appl. No.: 14/928,959

(22) Filed: Oct. 30, 2015

Related U.S. Application Data

(63) Continuation of application No. 14/152,972, filed on Jan. 10, 2014, now Pat. No. 9,195,860.

(51) Int. Cl.
*G06G 7/16* (2006.01)
*H03H 17/02* (2006.01)

(52) U.S. Cl.
CPC ............ *G06G 7/16* (2013.01); *H03H 17/02* (2013.01)

(58) Field of Classification Search
CPC ..... G06G 7/16; H04L 25/025; H04L 25/0256; H04L 25/03019
See application file for complete search history.

(56) References Cited

U.S. PATENT DOCUMENTS

| | | | | |
|---|---|---|---|---|
| 5,321,850 A | * | 6/1994 | Backstrom | H03J 1/0008 375/267 |
| 5,339,365 A | * | 8/1994 | Kawai | H04N 1/40062 382/176 |
| 5,528,257 A | * | 6/1996 | Okumura | G09G 3/3607 345/94 |
| 5,754,950 A | * | 5/1998 | Petersson | H04B 7/0857 375/267 |
| 5,887,038 A | * | 3/1999 | Golden | H04L 1/06 375/347 |
| 6,418,175 B1 | * | 7/2002 | Pukkila | H04B 7/005 375/341 |
| 6,879,624 B2 | * | 4/2005 | Sano | H04B 7/0848 342/380 |
| 7,006,042 B2 | * | 2/2006 | Tong | H04B 7/0848 342/377 |
| 7,369,631 B1 | * | 5/2008 | Gifford | H04B 7/0837 375/346 |
| 9,001,877 B2 | * | 4/2015 | Rydstrom | H04B 7/0851 375/224 |
| 9,195,860 B1 | * | 11/2015 | Patapoutian | H03H 17/02 |
| 2013/0038745 A1 | * | 2/2013 | Myokan | H04N 5/144 348/208.99 |
| 2016/0004172 A1 | * | 1/2016 | Cox | G03F 7/70725 355/67 |

* cited by examiner

*Primary Examiner* — Thomas J Hiltunen
(74) *Attorney, Agent, or Firm* — Cesari & Reed, LLP; Kirk A. Cesari

(57) ABSTRACT

A circuit may be configured to adaptively combine two or more waveforms into a single waveform. The circuit can generate weighting factors based on received error signals, and can apply the weighting factors to the two or waveforms to be combined. In some examples, a circuit can be configured to receive input signals, receive error signals, generating a weighting coefficient based on at least some of the error signals, and determine an output signal based on the weighting coefficient and the input signals.

20 Claims, 9 Drawing Sheets

ADAPTIVELY COMBINING WAVEFORMS

CROSS-REFERENCE TO RELATED APPLICATION

The present application is a continuation of and claims priority to pending U.S. patent application Ser. No. 14/152,972, entitled "Adaptively Combining Waveforms", filed on Jan. 10, 2014, the contents of which are hereby incorporated by reference in their entirety.

SUMMARY

In certain embodiments, an apparatus may comprise a circuit configured to receive two or more input signals where each signal is provided by a separate source. The circuit may receive two or more error signals, each error signal corresponding to a different input signal. Further, the circuit may be configured to determine noise statistics based on the two or more error signals, generate a weighting coefficient based on the noise statistics, and determine an output signal based on the weighting coefficient and the two or more input signals.

In certain embodiments, a system may comprise multiple inputs configured to receive two or more input signals, a noise statistics generator circuit configured to generate noise statistics based on two or more error signals, and a weighting coefficient circuit configured to generate a weighting coefficient based on the noise statistics. Further, the system may include a weighting filter circuit coupled to the weighting coefficient generator circuit, and may be configured to determine an output signal based on the weighting coefficient and the two or more input signals.

In certain embodiments, a method may comprise receiving two or more input signals, receiving two or more error signals, each error signal corresponding to a different input signal. The method may further comprise determining noise statistics based on the two or more error signals, generating a weighting coefficient based on the noise statistics, and determining an output signal based on the weighting coefficient and the two or more input signals.

DETAILED DESCRIPTION

Figure 1:
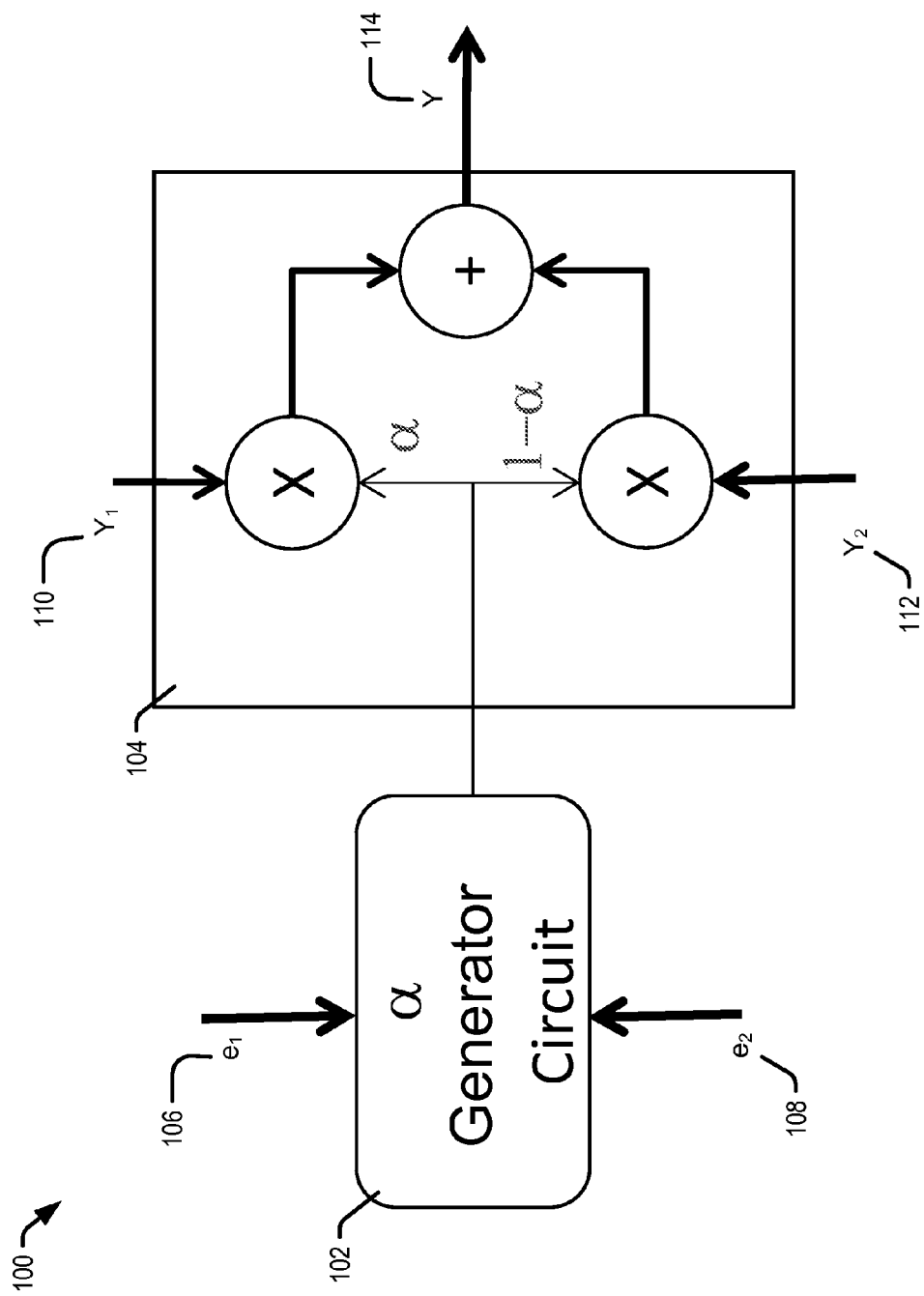
FIG. 1 is a system of adaptively combining waveforms, in accordance with certain embodiments of the present disclosure.

In the following detailed description of the embodiments, reference is made to the accompanying drawings which form a part hereof, and in which are shown by way of illustrations. It is to be understood that features of the various described embodiments may be combined, other embodiments may be utilized, and structural changes may be made without departing from the scope of the present disclosure. It is also to be understood that features of the various embodiments and examples herein can be combined, exchanged, or removed without departing from the scope of the present disclosure.

In accordance with various embodiments, the methods and functions described herein may be implemented as one or more software programs running on a computer processor or controller. In accordance with another embodiment, the methods and functions described herein may be implemented as one or more software programs running on a computing device, such as a personal computer that is using a disc drive. Dedicated hardware implementations including, but not limited to, application specific integrated circuits, programmable logic arrays, and other hardware devices can likewise be constructed to implement the methods and functions described herein. Further, the methods described herein may be implemented as a computer readable storage medium or device including instructions that when executed cause a processor to perform the methods.

The present disclosure generally relates to adaptive filters, and more specifically, the present disclosure adaptively combining waveforms. Some systems, such as electrical, electronic, motor drive, processing, or other systems may receive input signals from more than one source. The received signals can be combined to produce a single signal that can be provided to a receiver, such as a circuit, a transducer, an electric motor, or other device. In some systems, each input signal may be given equal weight; the information in each signal may affect the combined signal equally. For example, each input signal in a system combing two input signals may have a 50 percent weighting.

In some circumstances, it may be desirable to assign a different weight to the input signals. For example, a system may assign different weights to signals (waveforms) because of noise considerations (e.g. some signals may be noisier than others), signal reliability, importance, or other considerations. In some embodiments, a system may assign weights to two or more signals via a weighting factor, a processor, firmware, circuits (e.g. analog, digital, mixed signal), software, or by other methods. The signals can have the same or different assigned weighting, and the weighting may be a set value, may change over time, or upon detection of a trigger (e.g. changes in amplitude, signal to noise ratio, reliability, system requirements, etc.).

An input signal may be assigned a weight of between zero and one hundred percent; a weight of zero percent means that none of the information in the input signal is included in the combined signal, and a weight of one hundred percent means that only the information in the first signal is included in the combined signal. In a system with two input signals, signal A and signal B, the weighting factor can be determined by a weighting coefficient, α, which can have a value between zero and one, inclusive. The weighting of signals A and B can be α and 1−α, respectively. For example, when α=0.8, the weighting of signal A can be 80 percent, and the weighting of signal B may be 20 percent. When systems have three or more input signals, the weighting can be changed accordingly. For example, in a system with three input signals, signal A, signal B, and signal C, the weighting of signal A can be $α_A$, the weighting of signal B can be $α_B$, and the weighting of signal C can be $1−α_A−α_B$.

For illustrative purposes, the examples in this disclosure are directed to systems having two input signals and two error signals. However, the embodiments listed herein may apply to systems having three or more input and error signals, and to systems where the number of input signals and error signals are not the same.

Referring to FIG. 1, a system of adaptively combining waveforms is shown and is generally designated 100. The system 100 can be configured to produce an output waveform that contains information from two or more input signals. It can include a weighting coefficient generator circuit (WCGC) 102 coupled to a filter circuit 104. The WCGC 102 may also be coupled to two or more error signal sources (not shown), and the filter circuit 104 may be coupled to two or more input signal generators (not shown).

The WCGC 102, which may be a separate circuit, a system on chip (SOC), firmware, a processor(s), or other system not listed, or any combination thereof, can generate a weighting coefficient, a, based on error signals received from the error signal sources. The error signal sources, which may be programmable generators, oscillator circuits, amplifiers, thermal detectors, transducers, and so forth, can generate error signals (e.g. $e_1$ 106 and $e_2$ 108).

In some embodiments, the error signals $e_1$ 106 and $e_2$ 108 may be a measure of artifacts in other signals (e.g. input signals $Y_1$ 110 and $Y_2$ 112), and may be continuous signals or may be optionally updated by the error signal sources after a period of time. Artifacts in the input signals $Y_1$ 110 and $Y_2$ 112 may be noise due to as electrical noise, electromagnetic interference, temperature differentials, mechanical stress, vibrations, or other cause(s), or any combination thereof. When the profile of the artifacts (e.g. waveform, amplitude, frequency spectrum, etc.) changes, the corresponding error signals can change.

The filter circuit 104, which may be coupled to input signal generators (sources), such as programmable generators, amplifiers, data converters, filters, transducers, or other signal sources, may apply the weighting coefficient α to input signals $Y_1$ 110 and 1−α to $Y_2$ 112 to produce weighted input signals. The weighted input signals can be combined into a single output waveform Y 114.

The filter circuit 104 may be a separate circuit, a system on chip (SOC), firmware, a processor(s), or other system not listed, or any combination thereof. It may be part of an SOC, or be integrated with or otherwise coupled to the error signal generators and the input signal sources.

In an example embodiment, consider a situation in which the noise in the input signal $Y_1$ 110 changes. When the noise increases, the corresponding error signal $e_1$ 106 may change, which may cause the WCGC to generate a corresponding to the new value of noise in the input signal 110. The new value of the weighting coefficient may be applied to the input signal $Y_1$ 110 (1−a can be applied to the input signal $Y_2$ 112) by the filter 104, where it may be combined via waveform combiner with input signal $Y_2$ 112 to generate the combined waveform 114. In some embodiments, a may be updated after the WCGC receives a predetermined number of error signals. The method may apply in situations when the noise in the input signal $Y_1$ 110 decreases, when only the noise in the input signal $Y_2$ 112 changes, and when the noise in both input signals $Y_1$ 110 and $Y_2$ 112 change. Further, the method can apply to configurations with three or more input signals, three or more error signals, or any combination thereof.

Figure 2:
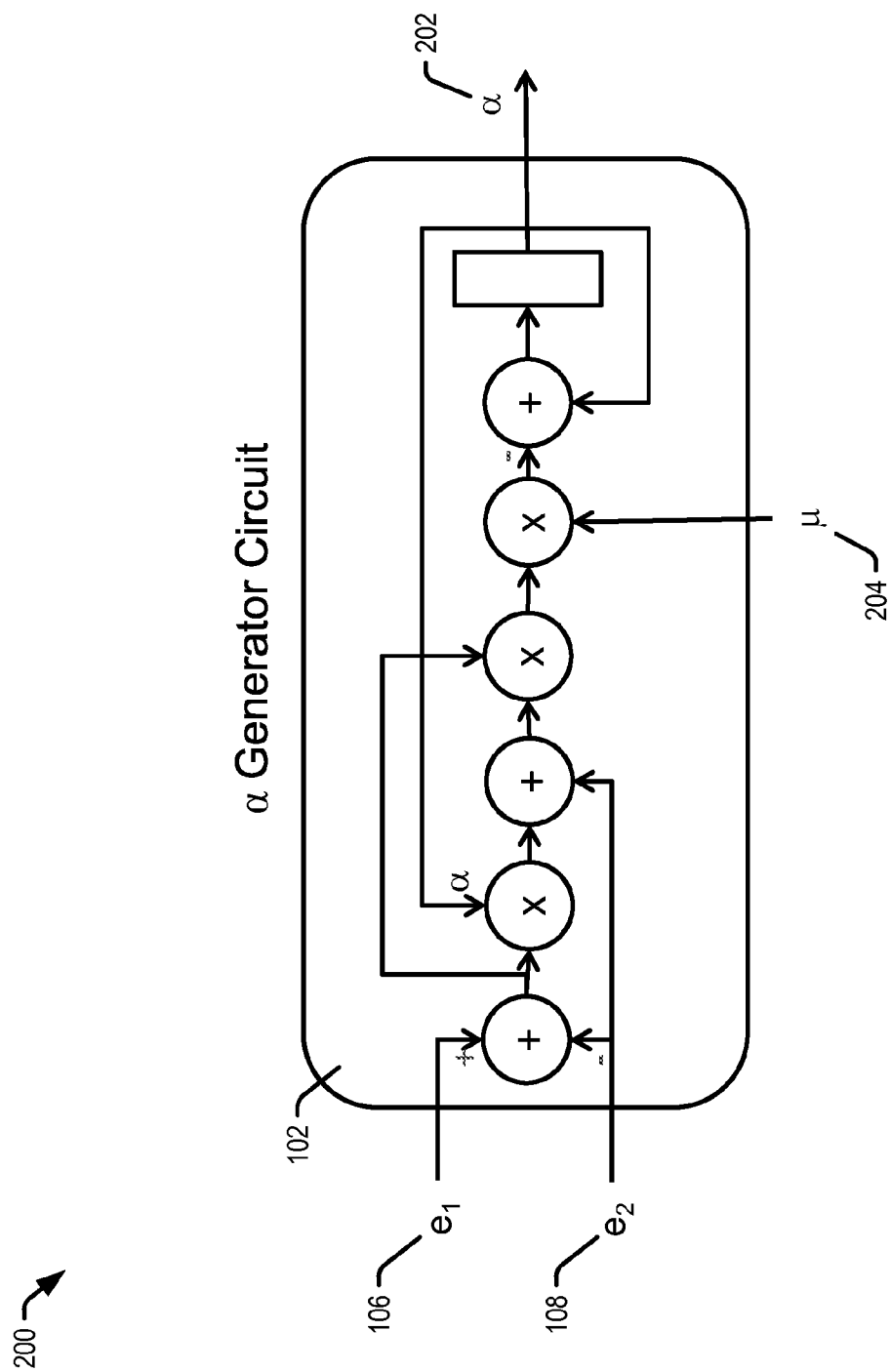
FIG. 2 is a system of adaptively combining waveforms, in accordance with certain embodiments of the present disclosure.

Referring to FIG. 2, a system of adaptively combining waveforms is shown and is generally designated 200. The system 200 can be an embodiment of system 100. In the embodiment of system 200, the weighting coefficient generator circuit (WCGC) 102 can generate a based on the error signals $e_1$ 106 and $e_2$ 108, and may include summing circuits, multipliers, and other circuits (not shown). The weighting coefficient α can be a measure of the cross correlation between input signals. In a multiple input single output (MISO) system, error signals corresponding to the input signals can be compared in a WCGC 102 to produce α.

Error signals $e_1$ 106 and $e_2$ 108, which may be continuous or updated by the error sources after a period of time (e.g. periodically, after receipt of a trigger, etc.), may be processed in real time by the WCGC 102. In some examples, the WCGC 102 may store received error signals in memory (not shown), and may determine α by averaging the stored error signals over a predetermined period of time. The WCGC 102 can optionally retrieve the error from a memory, or determine α from periodically captured error signal values or from error signals captured as a result detecting a trigger.

The WCGC may contain an external variable, μ, which may be adjusted to control the rate of change of α. In some examples, a circuit (e.g. a controller circuit, processor, programmable logic device, etc.), firmware, or software, can determine the value of μ. In some embodiments, the circuit can determine the value of μ by comparing the values of the error signals $e_1$ 106 and $e_2$ 108, the value of α, and the values of any input and output signals.

Figure 3:
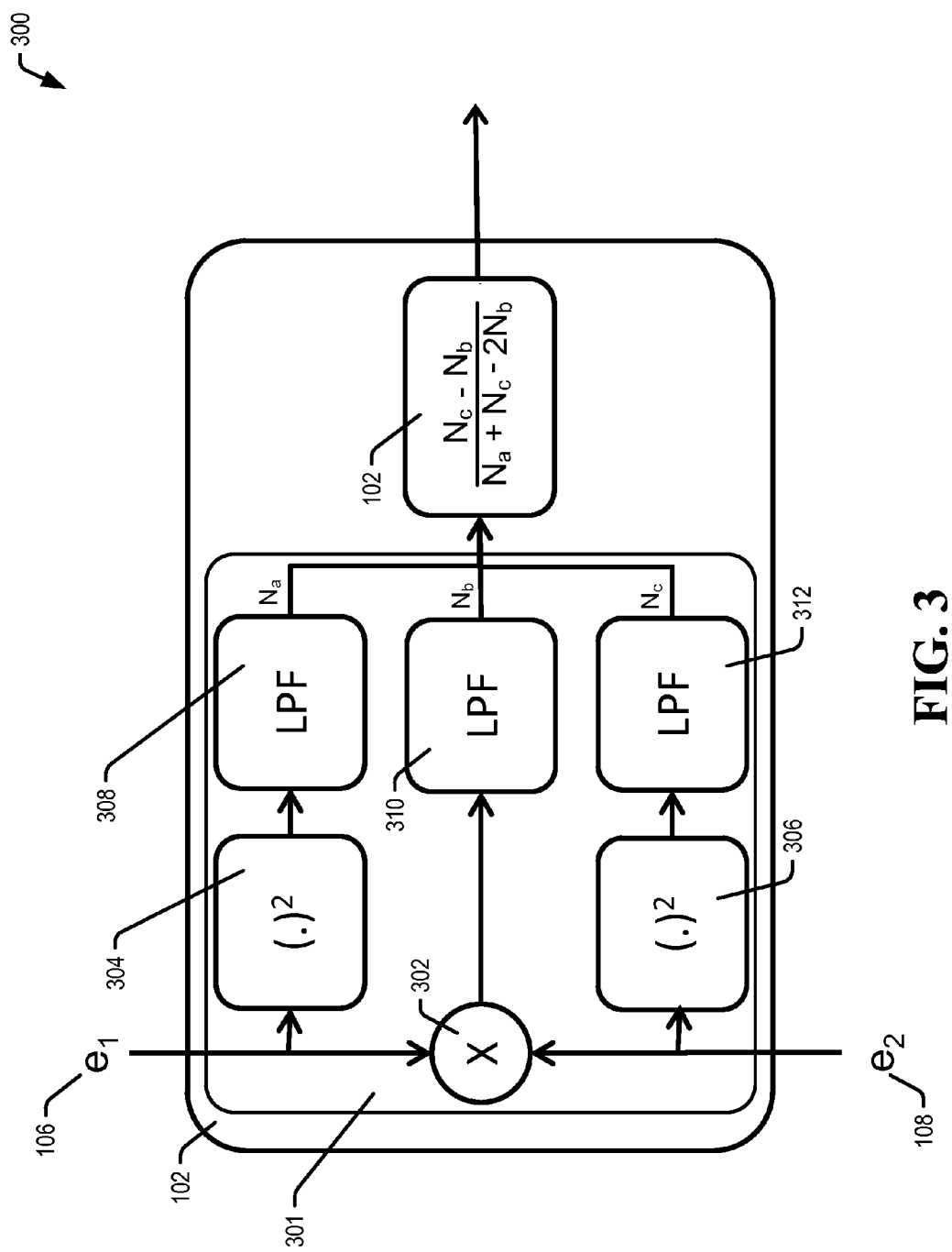
FIG. 3 is a system of adaptively combining waveforms, in accordance with certain embodiments of the present disclosure.

Referring to FIG. 3, a system of adaptively combining waveforms is shown and is generally designated 300. System 300 can be another embodiment of the weighting coefficient generator circuit (WCGC) 102 and can include a noise statistics generator (NSG) 301. The NSG 301 may include a multiplier 302 coupled to squaring multipliers 304 and 306, and to a filter, such as a low pass filter (LPF) 310. The squaring multipliers 304 and 306 may each be coupled to a filter (e.g. LPF 308 and 312, respectively). The filters 308, 310, and 312, may be infinite impulse response (IIR) filters, window based moving average filters, or other filters not listed, and can be coupled to the WCGC 102. The WCGC 102 may subsequently be coupled to the filter circuit 104 (not shown).

In some embodiments, the WCGC 102 may determine α using noise statistics produced by a noise statistics generator 301. Noise statistics can be an average value of a squared error signal, or of a product of error signals. For example, when error signal $e_1$ 106 is received by the NSG 301, it may be squared by the squaring multiplier 304, and then filtered by the low pass filter 308, which can produce a noise statistic, $N_a$. When error signal $e_2$ 108 is received, it may be squared by the squaring multiplier 306 and then filtered by the low pass filter 312, which can produce a noise statistics, $N_b$. The two error signals $e_1$ 106 and $e_2$ 108 may be multiplied together by a multiplier 302 to produce a product signal, $e_1 e_2$. The product signal can be filtered by the low pass filter 310 to produce the noise statistic, $N_c$.

The WCGC may generate a using the provided statistics, $N_a$, $N_b$, and $N_c$ via the equation:

$$\alpha = \frac{N_c - N_b}{N_a + N_c - 2N_b}.$$

The weighting coefficient, a, may be updated on the fly (e.g. adaptively), periodically, upon detection of a trigger, after receiving a predetermined number of error signals, or by other means not listed, and may be provided to the filter 104 (not shown).

Figure 4:
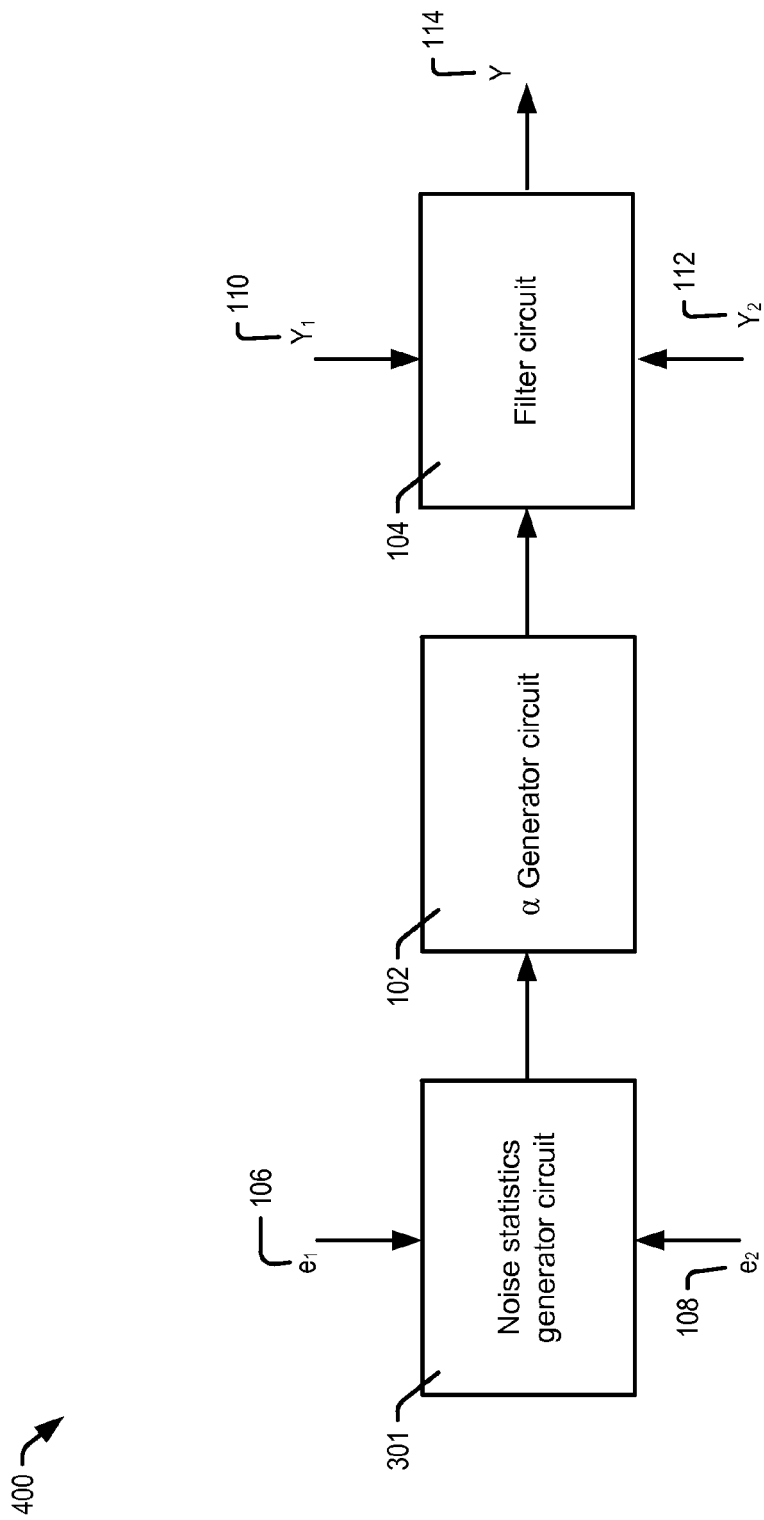
FIG. 4 is a system of adaptively combining waveforms, in accordance with certain embodiments of the present disclosure.

Referring to FIG. 4, a system of adaptively combining waveforms is shown and is generally designated 400. The system 400 can be another embodiment of the system 100, and can include a noise statistics generator circuit 301, a weighting coefficient generator circuit (WCGC) 102, and a filter circuit 104.

In some examples, a system can be configured to produce an output waveform, 114, which can contain information from the two input signals, $Y_1$ 110 and $Y_2$ 112. The amount of information provided to the output waveform by an input signal may depend on how noisy the signal is, that is it may depend on an amount of noise of the signal. The input signals $Y_1$ 110 and $Y_2$ 112 may be assigned different weights depending on an amount, characteristic, or measurement of noise in the respective signals.

Error signals $e_1$ 106 and $e_2$ 108, corresponding to the noise in the input signals $Y_1$ 110 and $Y_2$ 112, respectively, can be provided to the noise statistics generator 301 by error sources. The noise statistics generator 301 can generate noise statistics that may be provided to the WCGC 102, which can determine the weighting coefficient α. The weighting coefficient can be applied to the input signals $Y_1$ 110 and $Y_2$ 112 via the filter circuit 104, which may combine the weighted input signals into an output signal 114. The output signal may be subsequently provided to a receiving circuit or other device.

Figure 5:
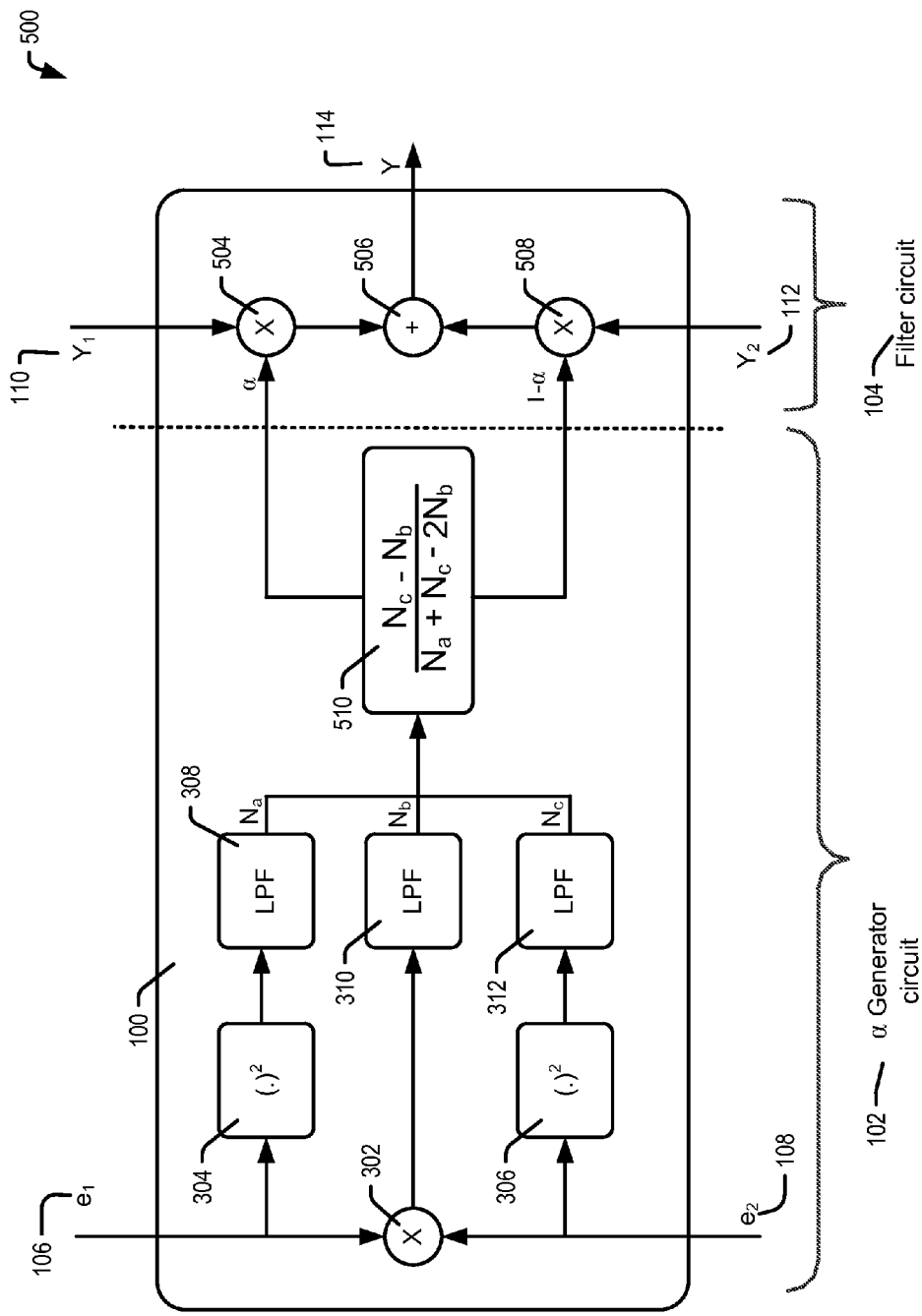
FIG. 5 is a system of adaptively combining waveforms, in accordance with certain embodiments of the present disclosure.

Referring to FIG. 5, a system of adaptively combining waveforms is shown and is generally designated 500. The system 500 can be another embodiment of systems 100 and 400. In some systems, such as the example embodiment 100, the noise statistics generator may be included in the WCGC 102. For instance, in an example embodiment 500, the system can include a WCGC 102, which may further include a multiplier 302 coupled to a filter (e.g. a low pass filter) 310, and to the squaring multipliers 304 and 306. The squaring multipliers 304 and 306 may be coupled to the low pass filters 308 and 312, respectively. The filters 308, 310, and 312, which may be infinite impulse response (IIR) filters, moving average filters, or other filters, may be coupled to a coefficient generator 510. The coefficient generator 510 may be coupled to the multipliers 504 and 508, which, in turn, are coupled to a waveform combiner (e.g. an adder, subtractor, etc.) 506.

The WCGC 102 can generate a weighting coefficient based on received error signals $e_1$ 106 and $e_2$ 108. The WCGC 102 can provide the weighting coefficient, a, to the filter circuit 104. The filter circuit may apply α and 1−α to inputs signals $Y_1$ 110 and $Y_2$ 112, respectively, to produce weighted input signals. The weighted input signals can be combined via the waveform combiner 506, to produce an output signal 114.

Figure 6:
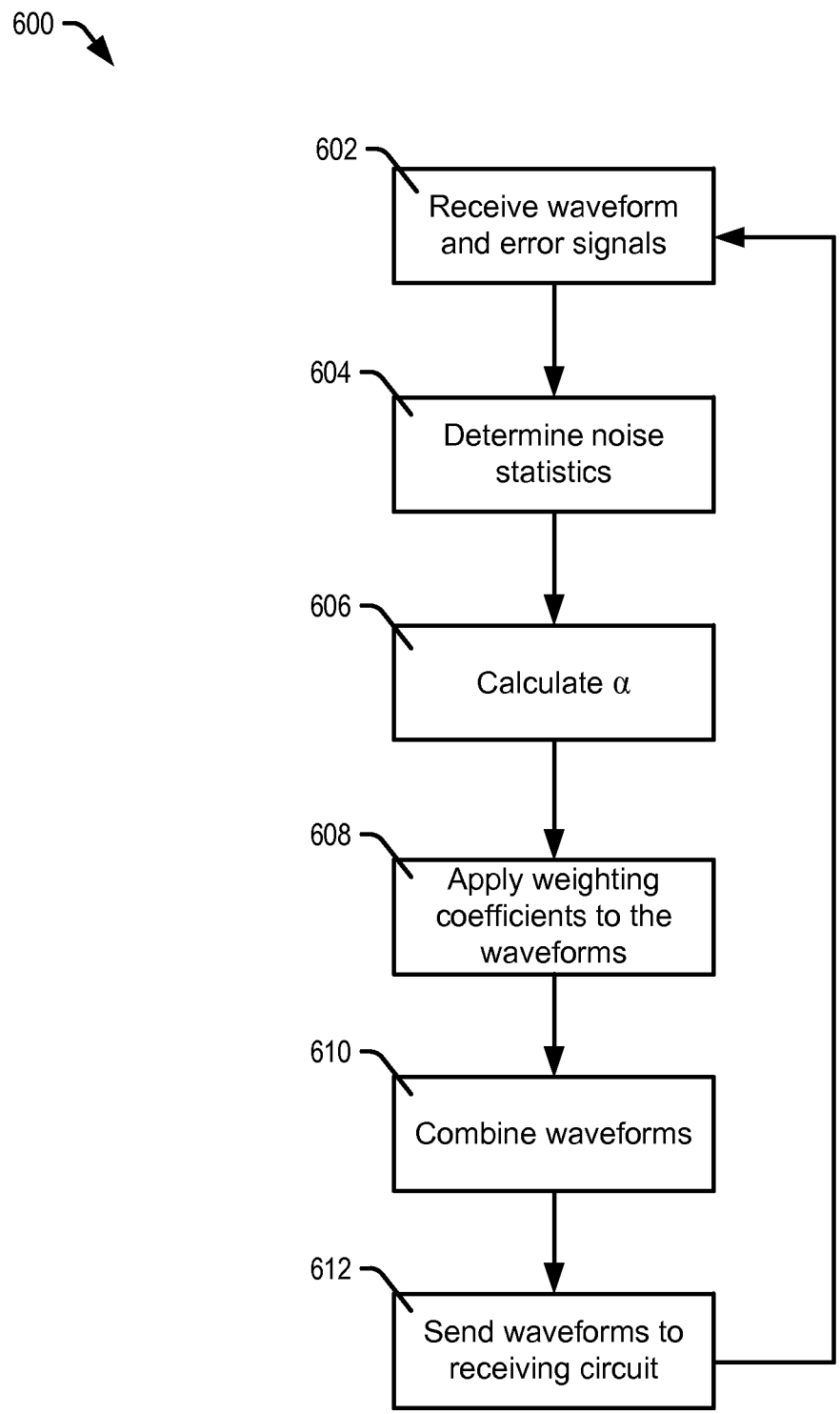
FIG. 6 is a flowchart of a method of combining waveforms, in accordance with certain embodiments of the present disclosure.

Referring to FIG. 6, a flowchart of a method of adaptively combining waveforms is shown and is generally designated 600. The method 600 can be an embodiment of the systems 100, 200, 300, 400, and 500. The system may receive error signals (e.g. $e_1$ 106 and $e_2$ 108) from error sources and input signals (e.g. $Y_1$ 110 and $Y_2$ 112) from input sources, at 602.

Noise statistics may be determined by the noise statistic generator 301, at 604, although in some embodiments, the noise statistics generator 301 may not be included. Step 604 may be skipped in configurations where the WCGC 102 generates the weighting coefficient without noise statistics.

The weighting coefficient, a, may be determined at 606 and provided to the filter circuit 104 where it can be applied to the input waveforms at 608. The input waveforms may be combined by a waveform combiner 506 (e.g. an adder, subtractor, etc.), and the combined waveform, Y 114, can be provided to a receiving circuit at 612. The process may repeat at 602.

All steps listed for the method may 600 be applied to systems that receive three or more input signals, three or more error signals, or any combination thereof. Components and circuits used to perform the operations in the method may be discrete, integrated into a system on chip (SOC), or other circuits. Further the steps can be carried out in a processor (e.g. a digital signal processor), implemented in software, implemented via firmware, or by other means.

Figure 7:
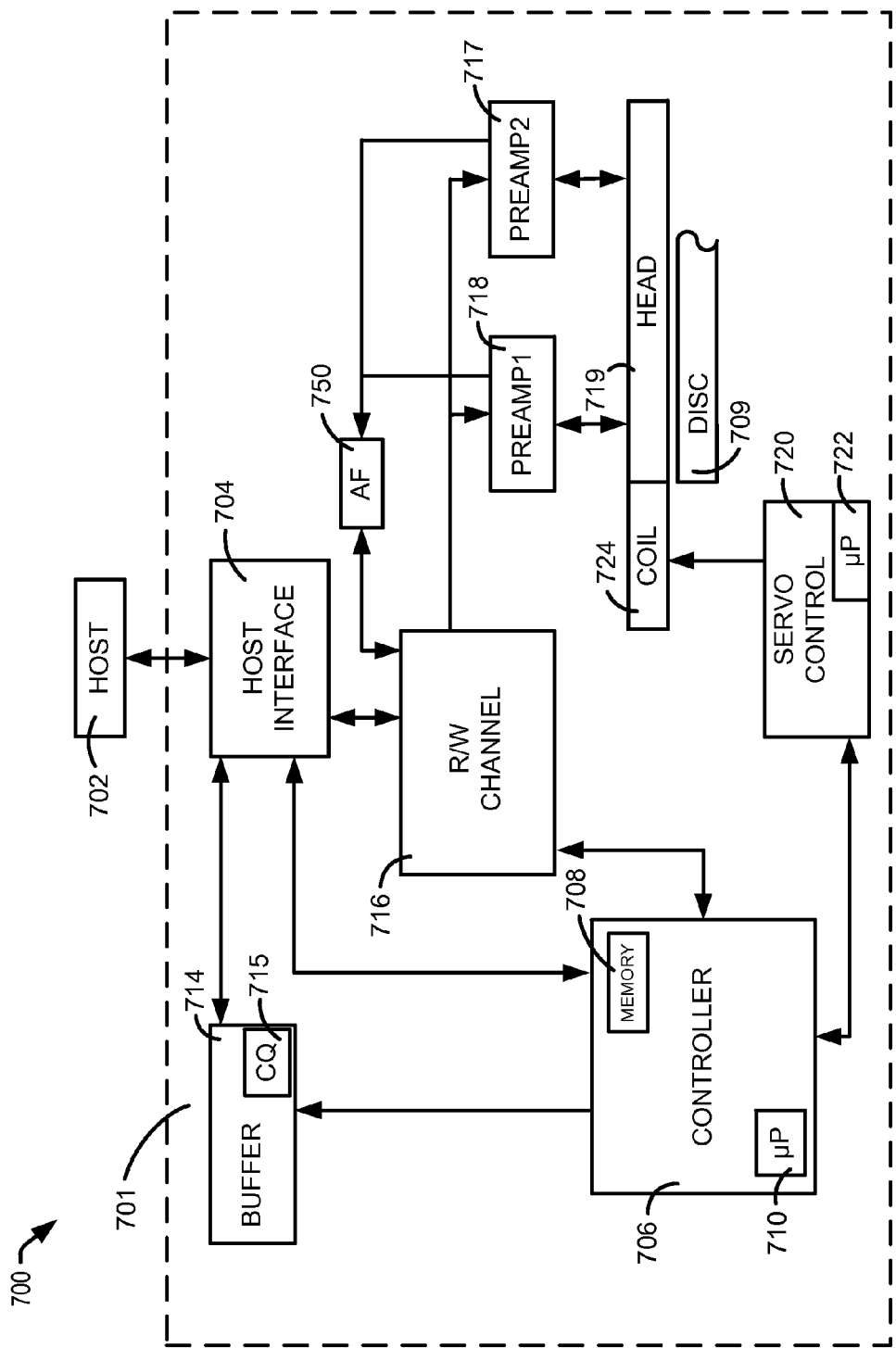
FIG. 7 is a system of adaptively combining waveforms, in accordance with certain embodiments of the present disclosure.

Referring to FIG. 7, a system of adaptively combining waveforms is shown and is generally designated 700. The system 700 provides a functional block diagram of a data storage device (DSD). The DSD 101 can optionally connect to be removable from a host device 102, which can be a device or system having stored data, such as a desktop computer, a laptop computer, a server, a digital video recorder, a photocopier, a telephone, a music player, other electronic devices or systems not listed, or any combination thereof. The data storage device 701 can communicate with the host device 702 via the hardware/firmware based host interface circuit 704 that may include a connector (not shown) that allows the DSD 701 to be physically connected and disconnected from the host 702.

The DSD 701 can include an adaptive filter (AF) 750, which, in certain embodiments, may include the AF 100 as described with respect to FIG. 1. The DSD 701 can also include a programmable controller 706 with associated memory 708, and processor 710. The programmable controller 706 may be part of a system on chip (SOC). A buffer 714 may temporarily store user data during read and write operations and can include a command queue (CQ) 715. The command queue (CQ) 715 may be volatile or non-volatile memory, and can temporarily store multiple access operations pending execution. The (R/W) channel 716 can encode data during write operations and reconstruct user data during read operations. The preamplifier/driver circuits, 718 and 717, can apply write currents to the head(s) 719. A servo control circuit 720 may use servo data from a servo sector to provide the appropriate current to the voice coil motor 724 to position the head(s) 719 over disc(s) 709. The controller 706 can communicate with a processor 722 to move the head(s) 719 to the desired locations (e.g. tracks) on the disc(s) 709 during execution of various pending commands in the command queue 715 or during other operations. The channel configurations and systems described herein may be implemented in the R/W channel 716 as hardware circuits, software, memory, or any combination thereof. The AF 750 may be a separate circuit, separate chip, included in a system on chip (SOC), or may be integrated into a channel circuit such as the R/W channel 716. The AF 750 can provide an output signal to circuits such as the R/W channel 716.

Data storage devices can be configured to read data from a track on the disc 709 with multiple read sensors. Two or more read sensors (not shown) may be located at different locations in the head 719, allowing the DSD 701 to make several readings (e.g. one for each sensor) of the same data location during one revolution of the disc 709. The sensors may each be coupled to a separate preamp, although in some embodiments, two or more sensors may be coupled to a single preamp. The example system 700 can have two sensors (not shown), each of which may be coupled to one of two included preamps, preamp one 718 and preamp two 717. When the sensors are over a servo field, the controller 706 may prevent the signals from all but one of the sensors from reaching the R/W channel 716 via adjusting the settings in the AF 750, or disabling functions in one or more circuits or sensors upstream of the AF 750. For example, the controller 706 may set the weighting coefficient to zero (or one), turn off a preamp output, disable the sensor, etc.

The R/W channel 716 may only receive one read signal; the read signals from the sensors can be combined into one signal via the adaptive filter (AF) 750. The sensors can provide the preamps 717 and 718 with read signal. The preamps may, in turn, condition the read signals and provide them to the AF 750 via other circuits, such as front end circuits (not shown), filters (not shown), or other circuits. The sensors may couple noise caused by media noise, vibrations, mechanical stress, sensor offsets, and so forth, into the read signals provided to the preamps 717 and 718. To minimize the effects of the noise on the output signal 114 provided to the R/W channel 716 by the AF 750, the AF 750 may apply a weighting factor to the signals provided by the preamps 718 and 717 (e.g. input signals $Y_1$ 110 and $Y_2$ 112, respectively). Error signals, which may be generated by loop detectors (not shown) and error signal generators (not shown), are discussed later in this document.

The AF 750 can be used in different data storage systems, such as shingled magnetic recording (SMR) systems, heat-assisted magnetic recording (HAMR) systems, bit patterned media systems, and so forth. The AF 750 can be configured to receive and combine signals from three or more sensors. In some embodiments, a DSD 701 may use a two dimension magnetic recording (TDMR) system whereby two or more tracks may be read concurrently. TDMR systems may position a first sensor over a first track, a second sensor over a second track, and so forth. When multiple read sensor systems are integrated with or otherwise combined with TDMR systems, the AF 750 may be used; one AF 750 may be coupled to the multiple sensors of each track, although in other examples, there may be one AF 750 circuit performing separate combining operations for each track.

Figure 8:
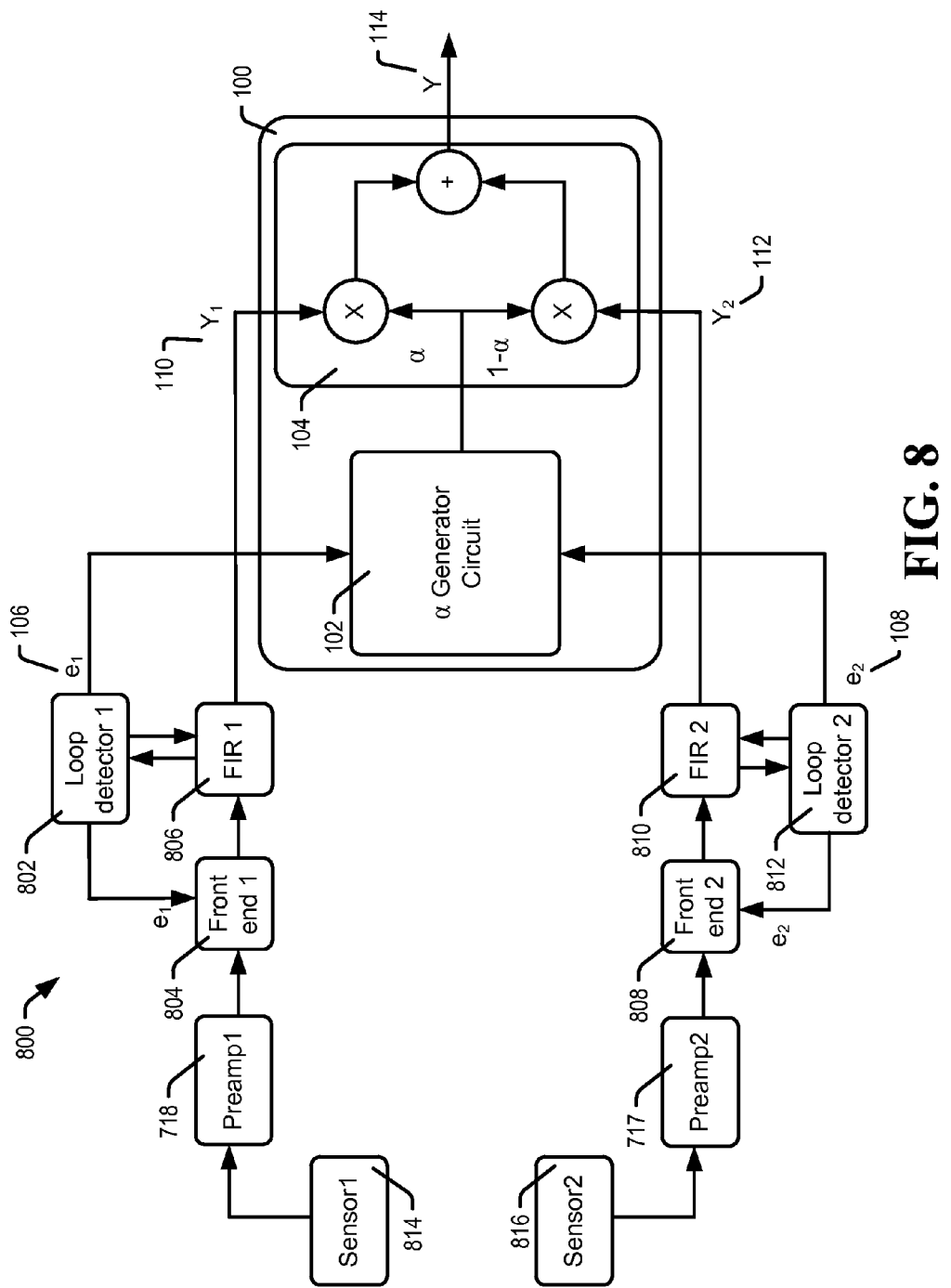
FIG. 8 is a system of adaptively combining waveforms, in accordance with certain embodiments of the present disclosure.

Referring to FIG. 8, a system of adaptively combining waveforms is shown and is generally designated 800. The system 800 may be an embodiment of the systems 100 and 700. An adaptive filter 100 may be incorporated into data storage devices to combine signals from two or more sensors. In the example embodiment 800, a data storage device may include a multiple read system including two sensors, sensor one 814 and sensor two 816, which can be coupled to preamp one 718 and preamp two 717, respectively. The preamps 717 and 718 may be coupled to front end circuits 804 and 808, respectively. The front end circuits 804 and 808, which may include phase locked loops (PLLs), automatic gain control (AGC) circuits, data converters, filters, or other circuits or any combination thereof, may be coupled to finite impulse response (FIR) filters 808 and 810, respectively. The FIR filters 806 and 810 may be coupled to the AF 100, and to loop detectors 802 and 812, which may, in turn, be coupled to the front end circuits 804 and 808.

Sensors, which can include transducers, 814 and 816 may collect information from data storage media by detecting magnetic fields and producing corresponding electrical signals. The sensor signals can be provided to one or more preamp circuits 718 and 717, where they can be buffered, amplified, or otherwise conditions before arriving at the front end circuits 804 and 808.

The front end circuits 804 and 808 can condition the read signals. In some systems, the sensors may be located several bit cell widths apart, which may result in read data from the sensors being out of sync. PLLs in the front end circuits 804 and 808 may realign, or sync, the read signals from the different sensors. The front end circuits 804 and 808 can provide the read signals to FIR filters 806 and 810, respectively.

The FIR filters 806 and 810 can shape the read signal to be compatible with the AF 100. The FIR filters 806 and 810 provide input signals $Y_1$ 110 and $Y_2$ 112, respectively, to the AF 100 and to the loop detectors 802 and 812. The loop detectors 802 and 812 may provide estimates of the input signals $Y_1$ 110 and $Y_2$ 112 to error generators (not shown). The error generators, which can be integrated into the loop detectors 802 and 812, may generate error signals $e_1$ 106 and $e_2$ 108 based on an FIR filter output, and may update the error signals at a slower rate than the input signal frequency. For example, loop detectors 802 and 812 may update the error signals $e_1$ 106 and $e_2$ 108 once for every N bits of input signal data. The loop detectors 802 and 812 can provide the error signals $e_1$ 106 and $e_2$ 108 to the front end circuits 804 and 808, and to the FIR filter circuits 806 and 810. The front end circuits 804 and 808, and the FIR filter circuits 806 and 810, may use the error signals $e_1$ 106 and $e_2$ 108 to update settings in response to sensor and other data. The loop detectors 802 and 812 can provide the error signals $e_1$ 106 and $e_2$ 108 to the WCGC 102.

Figure 9:
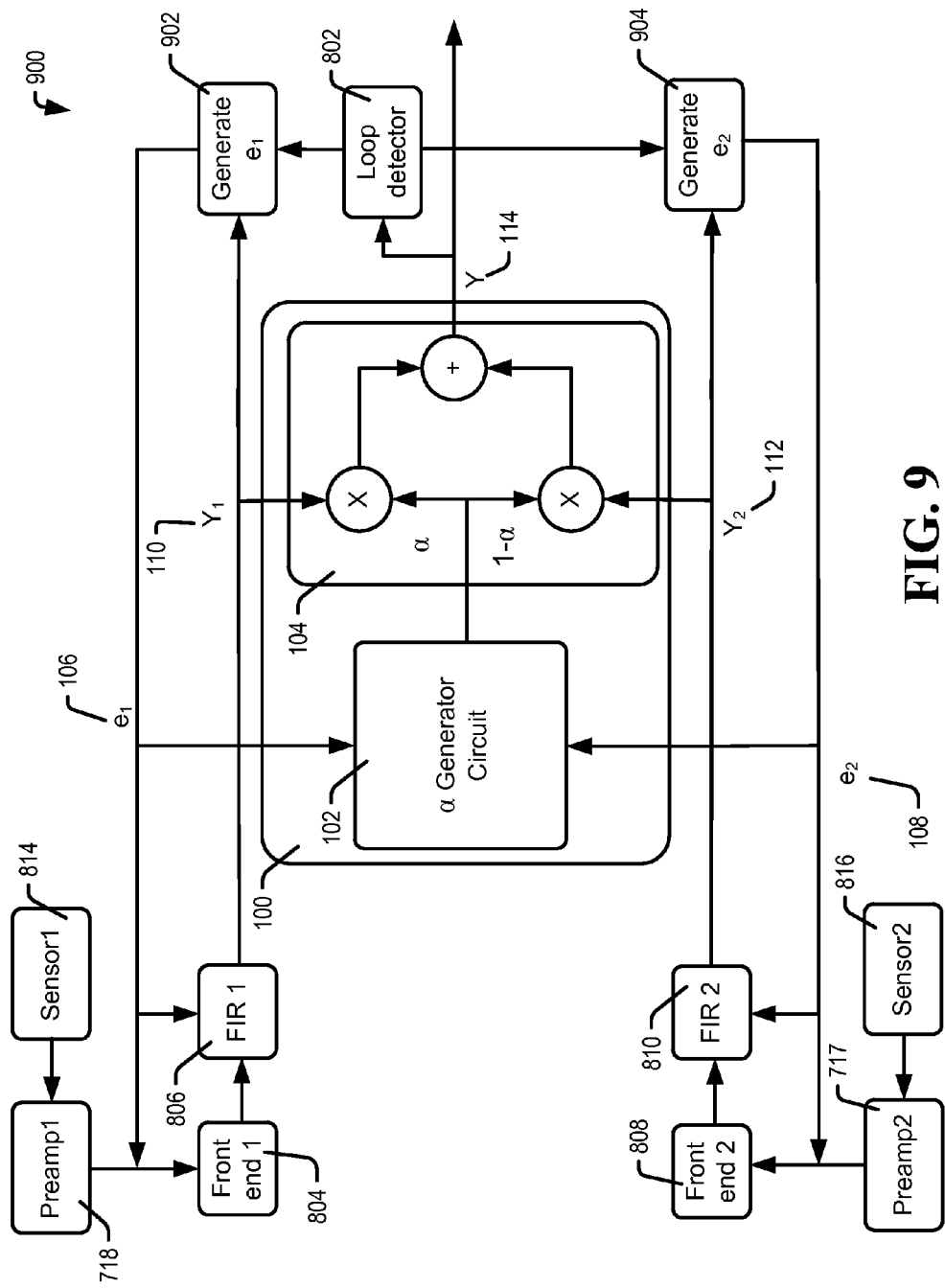
FIG. 9 is a system of adaptively combining waveforms, in accordance with certain embodiments of the present disclosure.

Referring to FIG. 9, a system of adaptively combining waveforms is shown and is generally designated 900. The system 900 may be an embodiment of the systems 100, 700, and 800, and may include a single loop detector 802. A single loop detector may be chosen as a configuration because it would use less area of a silicon chip than two loop detectors, thereby potentially saving cost. Furthermore, the system 900 can include sensors one and two (814 and 816), preamps one and two (718 and 717), front end circuits one and two (804 and 808), and FIR filters one and two (806 and 810). The system 900 may also include error generation circuits one and two (902 and 904) and an adaptive filter AF 100 having a WCGC 102 and a filter circuit 104.

The AF 100 can provide an output signal Y 114 to a receiving circuit, such as an R/W channel 716, and to the loop detector (detector) 802. The loop detector 802 can provide estimates of the input signals, $Y_1$ 110 and $Y_2$ 112, to error signal generators 902 and 904. The error signal generators 902 and 904 can generate error signals $e_1$ 106 and $e_2$ 108, based on the loop detector 802 signals and FIR filter 806 and 810 signals. Error signals $e_1$ 106 and $e_2$ 108 can update front ends 804 and 808, and FIR filters 806 and 810. The signals may also be inputted to the WCGC 102.

The illustrations, examples, and embodiments described herein are intended to provide a general understanding of the structure of various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. For example, the figures and above description provide examples of architecture and voltages that may be varied, such as for design requirements of a system. Moreover, although specific embodiments have been illustrated and described herein, it should be appreciated that any subsequent arrangement designed to achieve the same or similar purpose may be substituted for the specific embodiments shown.

This disclosure is intended to cover any and all subsequent adaptations or variations of various embodiments. Combinations of the above examples, and other embodiments not specifically described herein, will be apparent to those of skill in the art upon reviewing the description. Additionally, the illustrations are merely representational and may not be drawn to scale. Certain proportions within the illustrations may be exaggerated, while other proportions may be reduced. Accordingly, the disclosure and the figures are to be regarded as illustrative and not restrictive.

What is claimed is:

1. An apparatus comprising:
    a circuit including:
        a first input and a second input to receive a first input signal and a second input signal, and each input signal is received from a separate source;
        a first error input to receive a first error signal and a second error input to receive a second error signal, the first error signal is associated with the first input signal and the second error signal is associated with the second input signal;
        a noise statistics generation circuit configured to determine noise statistics based on the first error signal and the second error signal, the noise statistics including a first noise statistic, a second noise statistic, and a third noise statistic;
        a weighting coefficient generator circuit configured to generate a weighting coefficient based on the first noise statistic, the second noise statistic, and the third noise statistic; and
        a filter circuit configured to determine an output signal by:
            generating a first weighted signal based on the weighting coefficient and the first input signal;
            generate a second weighted signal based on the weighting coefficient and the second input signal; and
            combining the first weighted signal and the second weighted signal to produce the output signal.

2. The apparatus of claim 1 wherein each of the first error signal and the second error signal are provided by a separate source.

3. The apparatus of claim 1 further comprising:
    a detector circuit having a single loop detector configured to provide an estimate of each input signal to a respective error signal generator circuit; and
    a first error signal generator signal circuit and a second error signal generator signal circuit, both configured to receive an estimate of a respective input signal and generate a corresponding error signal.

4. The apparatus of claim 1 further comprising a detector circuit having two or more loop detectors, each configured to provide an estimate of an input signal to a respective error signal generator circuit to generate an error signal.

5. The apparatus of claim 1 comprising the circuit further including:
    the noise statistics generation circuit configured to determine the first noise statistic, the second noise statistic, and the third noise statistic by:
        squaring a first error signal to produce a first squared error signal;
        filtering the first squared error signal to generate the first noise statistic;
        squaring a second error signal to produce a second squared error signal;
        filtering the second squared error signal to generate the second noise statistic;
        multiplying the first error signal and the second error signal to produce a product signal; and
        filtering the product signal to generate the third noise statistic.

6. The apparatus of claim 5 comprising the weighting coefficient generator circuit further configured to generate the weighting coefficient ("α") by:

$$\alpha = (N_c - N_b)/(N_a + N_c - 2N_b)$$

Where $N_a$=the first noise statistic;
$N_c$=the second noise statistic; and
$N_b$=the third noise statistic.

7. The apparatus of claim 5 comprising the filter circuit further including:
    a multiplier configured to multiply a first input signal associated with the first error signal and the weighting coefficient to produce a first weighted signal;
    a multiplier configured to multiply a second input signal associated with the second error signal by one minus the weighting coefficient to produce a second weighted signal; and
    a combiner configured to combine the first weighted signal and the second weighted signal to produce the output signal.

8. The apparatus of claim 1 comprising the circuit configured to:
    when there are more than two input signals:
        generate a first weighting coefficient for a first set of input signals and a next weighting coefficient for a next set of input signals;
        multiply a first input signal by the first weighting coefficient to produce a first weighted signal;
        multiply a next input signal by the next weighting coefficient to produce the next weighted signal;
        multiply a last input signal by one minus the first weighting coefficient and the next weighting coefficient to produce a last weighted signal; and
        combine the first weighted signal, the next weighted signal, and the last weighted signal to produce the output signal.

9. The apparatus of claim 1 further comprising:
    a transducer configured to read data from a data storage medium;
    an finite impulse response (FIR) filter coupled to the transducer and configured to filter a read signal from the data storage medium to produce the first input signal; and
    a detector circuit coupled to the FIR filter and configured to generate the first error signal.

10. A system comprising:
    multiple inputs to receive two or more input signals;
    a noise statistics generator circuit configured to generate noise statistics based on two or more error signals corresponding to the two or more input signals, the noise statistics including a first noise statistic, a second noise statistic, and a third noise statistic;
    a weighting coefficient generator circuit coupled to the noise statistics generator circuit and configured to generate a weighting coefficient based on the first noise statistic, the second noise statistic, and the third noise statistic; and a weighting filter circuit coupled to the weighting coefficient generator circuit, and configured to determine an output signal based on the weighting coefficient and the two or more input signals; and at least one loop detector coupled to the noise statistics generator circuit and configured to produce the two or more error signals corresponding to the two or more input signals.

11. The system of claim 10 further comprising:
the noise statistics generator circuit includes:
   a first multiplier configured to square a first error signal to produce a first squared error signal;
   a second multiplier configured to multiply the first error signal and a second error signal to produce a product signal; and
   a third multiplier configured to square the second error signal to produce a second squared error signal; and
the noise statistics generator circuit is configured to determine the noise statistics based on the first squared error signal, the product signal, and the second squared error signal.

12. The system of claim 11 further comprising:
the noise statistics generator includes:
   a first filter coupled to the first multiplier and configured to produce a first noise statistic based on the first squared error signal;
   a second filter coupled to the second multiplier and configured to produce a second noise statistic based on the product signal;
   a third filter coupled to the third multiplier and configured to produce a third noise statistic based on the second squared error signal; and
the weighting coefficient generator coupled to the first filter, the second filter and the third filter and configured to generate the weighting coefficient based on the first noise statistic, the second noise statistic, and the third noise statistic.

13. The system of claim 12 further comprising:
a combiner filter circuit coupled to the coefficient generator and including:
   a fourth multiplier coupled to the coefficient generator and configured to receive a first input signal;
   a fifth multiplier coupled to the coefficient generator and configured to receive a second input signal; and
   a waveform combiner coupled to the fourth multiplier and the fifth multiplier, the waveform combiner configured to combine an output of the fourth multiplier and an output of the fifth multiplier to produce a combined output signal.

14. The system of claim 13 further comprising:
the fourth multiplier configured to multiply the first input signal with the weighting coefficient to produce a first weighted input signal;
the fifth multiplier configured to multiply the second input signal with one minus the weighting coefficient to produce a second weighted input signal;
the waveform combiner configured to combine the first weighted input signal and the second weighted input signal to produce an output signal; and
the waveform combiner configured to provide the combined output signal to an output.

15. The system of claim 14 further comprising:
the first multiplier coupled to a first transducer in a data storage medium; and
the second multiplier coupled to a second transducer in a data storage medium.

16. The system of claim 15 further comprising:
the first multiplier coupled to a first finite impulse response (FIR) filter;
the first FIR filter coupled to the first transducer;
the second multiplier coupled to a second FIR filter; and
the second FIR filter coupled to the second transducer.

17. A method comprising:
receiving a first input signal and a second input signal, each input signal provided by a separate source;
receiving a first error signal and a second error signal, the first error signal based on the first input signal and the second error signal based on the second input signal;
determining noise statistics based on the first error signal and the second error signal, the noise statistics including a first noise statistic, a second noise statistic, and a third noise statistic;
generating a weighting coefficient based on the first noise statistic, the second noise statistic, and the third noise statistic; and
determining an output signal based on the weighting coefficient, the first input signal, and the second input signal.

18. The method of claim 17 further comprising:
generating a first noise statistic by:
   squaring the first error signal to produce a first squared error signal;
   filtering the first squared error signal to generate the first noise statistic;
generating a second noise statistic by:
   multiplying the first error signal with the second error signal to produce a product signal;
   filtering the product signal to produce the second noise statistic;
generating a third noise statistic by:
   squaring the second error signal to produce a second squared error signal;
   filtering the second squared error signal to generate the third noise statistic; and
generating the weighting coefficient based on the first noise statistic, the second noise statistic, and the third noise statistic.

19. The method of claim 18 further comprising:
determining a first weighted signal based on the first input signal and the weighting coefficient;
determining a second weighted signal based on the second input signal and the weighting coefficient;
combining the first weighted signal and the second weighted signal to produce an output signal; and
providing the output signal to a receiver.

20. The apparatus of claim 1 wherein the first noise statistic is generated based on a square of the first error signal, the second noise statistic is generated based on a square of the second error signal, and the third noise statistic is a product signal based on the first error signal and the second error signal.

* * * * *